June 19, 1962 W. FULOP 3,040,219

TRANSISTORS

Filed Dec. 7, 1959

Inventor
W. FULOP
By C. H. Suydam
AGENT

United States Patent Office 3,040,219
Patented June 19, 1962

3,040,219
TRANSISTORS

Walter Fulop, Aldwych, London, England, assignor to International Standard Electric Corporation, New York, N.Y.

Filed Dec. 7, 1959, Ser. No. 857,983
Claims priority, application Great Britain Dec. 12, 1958
2 Claims. (Cl. 317—235)

The present invention relates to transistors.

In the production of transistors by diffusion processes the impurity concentration in the base region varies with position and in many cases is highest in that part of the base region adjacent to the emitter region. The use of these processes enables a narrow base region to be obtained and further, if there is an impurity gradient, a "built-in" electric field is produced. Both of these effects lead to a short transit time for minority carriers across the base region. However, a disadvantage of having the emitter region adjacent to a low resistivity part of the base region is that the device has a relatively low emitter-base breakdown voltage.

It is an object of the present invention to increase the emitter-base breakdown voltage in transistors.

Accordingly the present invention provides a transistor in which there is an additional layer between the emitter region and the base region, the said layer having a lower impurity concentration than those parts of the said emitter and base regions adjacent thereto.

An embodiment of the invention will now be described with reference to the accompanying drawings, in which.

Figure 1:
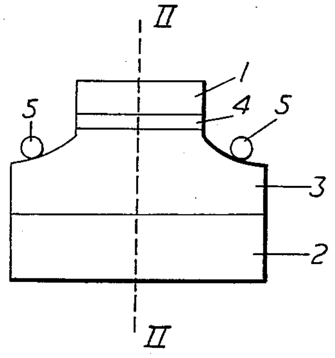
FIG. 1 shows schematically a transistor according to the invention.

The transistor shown in FIG. 1 comprises an emitter region 1 and a collector region 2 of the same type conductivity separated by a base region 3 of the opposite type conductivity. Between the emitter region 1 and the base region 3 is an additional region 4 of the same type conductivity as the latter. Connection is made to the base region 3 by means of a ring base contact 5 and to the emitter and collector regions by any form of conventional contact (not shown). No connection is made to the additional region 4 and this region is left floating during the operation of the device.

Figure 2:
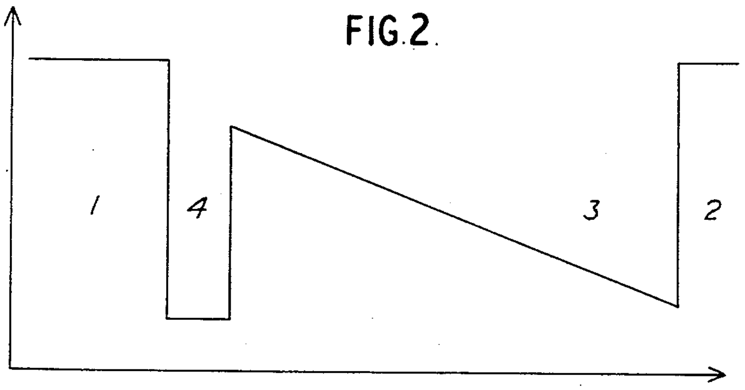
FIG. 2 shows the variation of the impurity concentration along the line II in FIG. 1.

In FIG. 2 the logarithm of the impurity concentration (ln $N_I$) is plotted as ordinate and distance along the line II in FIG. 1 as abscissa. The emitter, collector base and additional regions are indicated by the numerals 1, 2, 3 and 4, respectively, as in FIG. 1. Since each impurity atom provides one extra current carrier which is capable of taking part in conduction at room temperature a plot of the distribution of the available current carriers would be similar to that shown in FIG. 2.

FIG. 2 indicates that whilst the emitter and collector regions 1 and 2 are relatively highly doped the doping in the base region 3 varies with position and is higher near to the emitter than the collector. This brings about the built-in field, referred to above, which urges any minority carriers away from the neighbourhood of the emitter region and towards the collector region. The additional region

4 is less heavily doped than the emitter region or that part of the base region which is adjacent to it.

Transistors of the above form of construction may be made from semiconductor materials such as germanium or silicon and may be of the P-N-P or N-P-N type. In making a P-N-P type germanium transistor, for example, a piece of germanium having the impurity concentration profile shown for regions 3 and 4 in FIG. 2 can be made by well known techniques of "in and out diffusion." Emitter and collector regions can then be made by an alloying or diffusion process.

A suitable value for the resistivity of the additional region 4 is between 6 and 30 ohm cms. when the resistivity of the base region 3 ranges from less than 1 ohm cm. next to the additional region up to between 5 and 20 ohm cms. next to the collector region. For a base region of approximately $10^{-4}$ to $1.5 \times 10^{-3}$ cms. thickness the additional region may be approximately $10^{-4}$ cms. thick, and leads to emitter-base breakdown voltages of approximately 20–40 volts compared with approximately 2–5 volts for similar transistors having no additional region.

Although a transistor having an impurity concentration varying with position as shown in FIG. 2 was described in the above embodiment it will be appreciated that the use of an additional region 4 is not limited to this type of device. In fact such an additional region can be included in any type of transistor in order to increase the emitter-base breakdown voltage. Moreover, although the additional region 4, above, is of the same conductivity type as the base region it can instead be made of the same conductivity type as the emitter region, provided that its impurity concentration is lower than that of the emitter and base regions adjacent to it.

While the principles of the invention have been described above in connection with specific embodiments, and particular modifications thereof, it is to be clearly understood that this description is made only by way of example and not as a limitation on the scope of the invention.

What I claim is:

1. A transistor having emitter, base, and collector regions, said base region having a lower impurity concentration than do said emitter and collector regions: characterized in that between said emitter and base regions there is an additional region of the same conductivity type as said base region but having a lower impurity concentration than do those parts of said emitter and base regions adjacent thereto.

2. A transistor according to claim 1 in which the impurity concentration in said base region increases in the direction of said emitter region and in which the thickness of said additional region is substantially $10^{-4}$ cms. and the thickness of said base region is between $10^{-4}$ and $1.5 \times 10^{-3}$ cms.

References Cited in the file of this patent

UNITED STATES PATENTS

| | | |
|---|---|---|
| 2,810,870 | Hunter et al. | Oct. 22, 1957 |
| 2,811,653 | Moore | Oct. 29, 1957 |
| 2,858,489 | Henkels | Oct. 28, 1958 |
| 2,895,058 | Pankove | July 14, 1959 |
| 2,937,324 | Kroko | May 17, 1960 |
| 2,953,488 | Shockley | Sept. 20, 1960 |